United States Patent [19]

Kerth et al.

[11] Patent Number: 5,376,936
[45] Date of Patent: Dec. 27, 1994

[54] ONE-BIT SWITCHED-CAPACITOR D/A CIRCUIT WITH CONTINUOUS TIME LINEARITY

[75] Inventors: Donald A. Kerth, Austin, Tex.; Dan B. Kasha, Seattle, Wash.

[73] Assignee: Crystal Semiconductor Corporation, Austin, Tex.

[21] Appl. No.: 78,591

[22] Filed: Jun. 16, 1993

[51] Int. Cl.⁵ .............................................. H03M 1/66
[52] U.S. Cl. ..................................... 341/150; 341/144
[58] Field of Search ............... 341/150, 144, 152, 155, 341/172, 166

[56] References Cited

U.S. PATENT DOCUMENTS

| | | | |
|---|---|---|---|
| 4,521,762 | 6/1985 | Kapral | 341/122 |
| 4,698,596 | 10/1987 | Haigh et al. | 328/127 |
| 4,918,454 | 4/1990 | Early et al. | 341/172 |

*Primary Examiner*—Brian K. Young
*Attorney, Agent, or Firm*—Gregory M. Howison

[57] ABSTRACT

A modified lossy integrator digital-to-analog converter includes an amplifier (46) that receives an input on a summing node (48) and provides an output on a node (52). A feedback capacitor (50) is disposed across the input and output and has an output switched-capacitor (54) disposed in parallel therewith to passively distribute the charge thereacross. Switches (60) and (66) are operable to control the switching operation of the capacitor (54). Two input switched capacitors (70) and (94) are controlled by associated switches to switch charge onto the summing node (48) in a first clock cycle $\phi_2$. A one-bit data stream modulates the operation such that either the charge from the capacitor (78) is dumped onto the summing node (48) or the charge from the capacitor (94) is dumped onto the summing node (48). This operation during the $\phi_2$ cycle provides an integrated output that is slew-limited. The full charge of the selected capacitor (78) or (94) is allowed to be completely dumped onto the node (48) prior to the output switched capacitor (54) being disposed across the feedback capacitor (50). This allows for a linear operation in this range. Thereafter, the charge is passively distributed across the feedback capacitor (50) in a linear fashion associated with the lossy integrator. This provides a conversion from a digital signal one-bit data stream to a continuous time output analog signal.

14 Claims, 7 Drawing Sheets

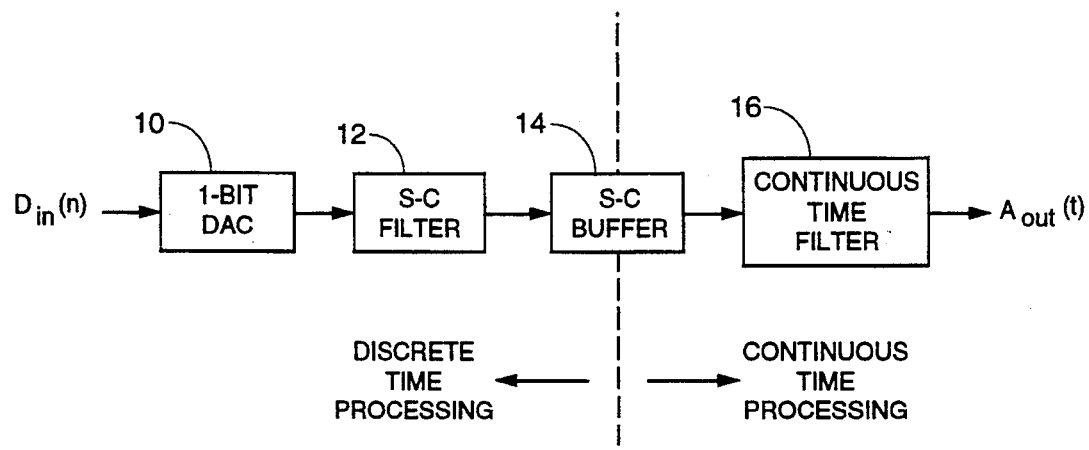
(PRIOR ART) FIG.1A
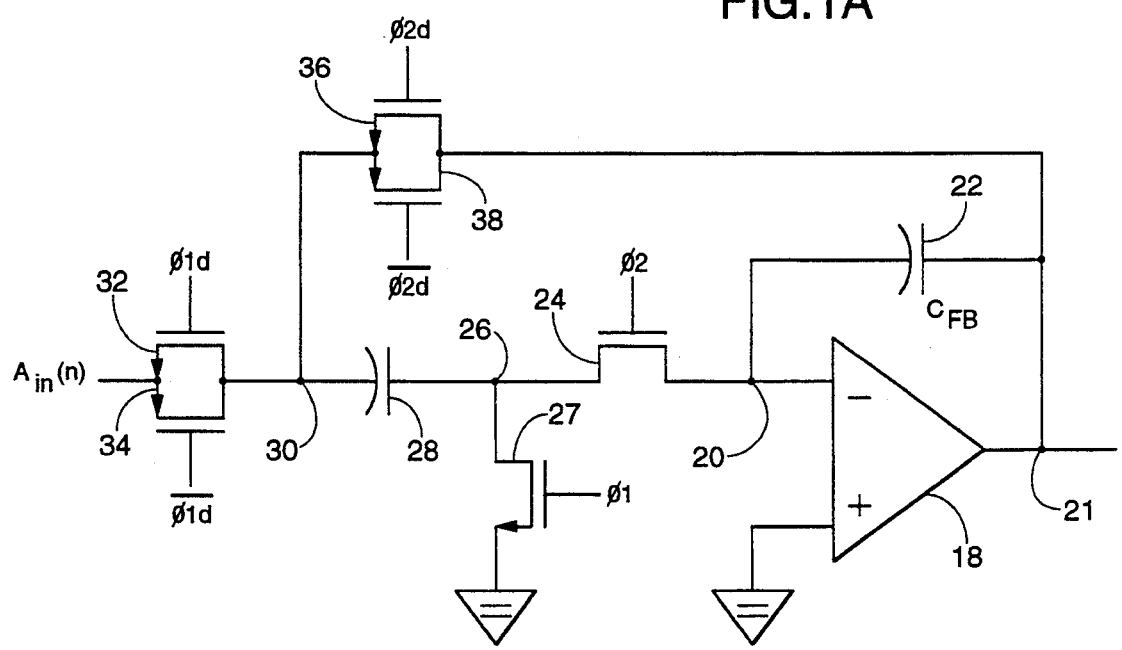
(PRIOR ART) FIG.1B
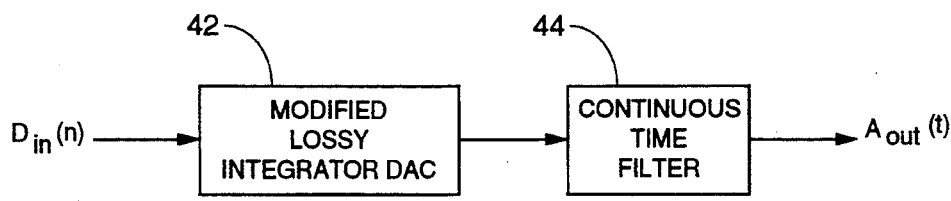
FIG.2

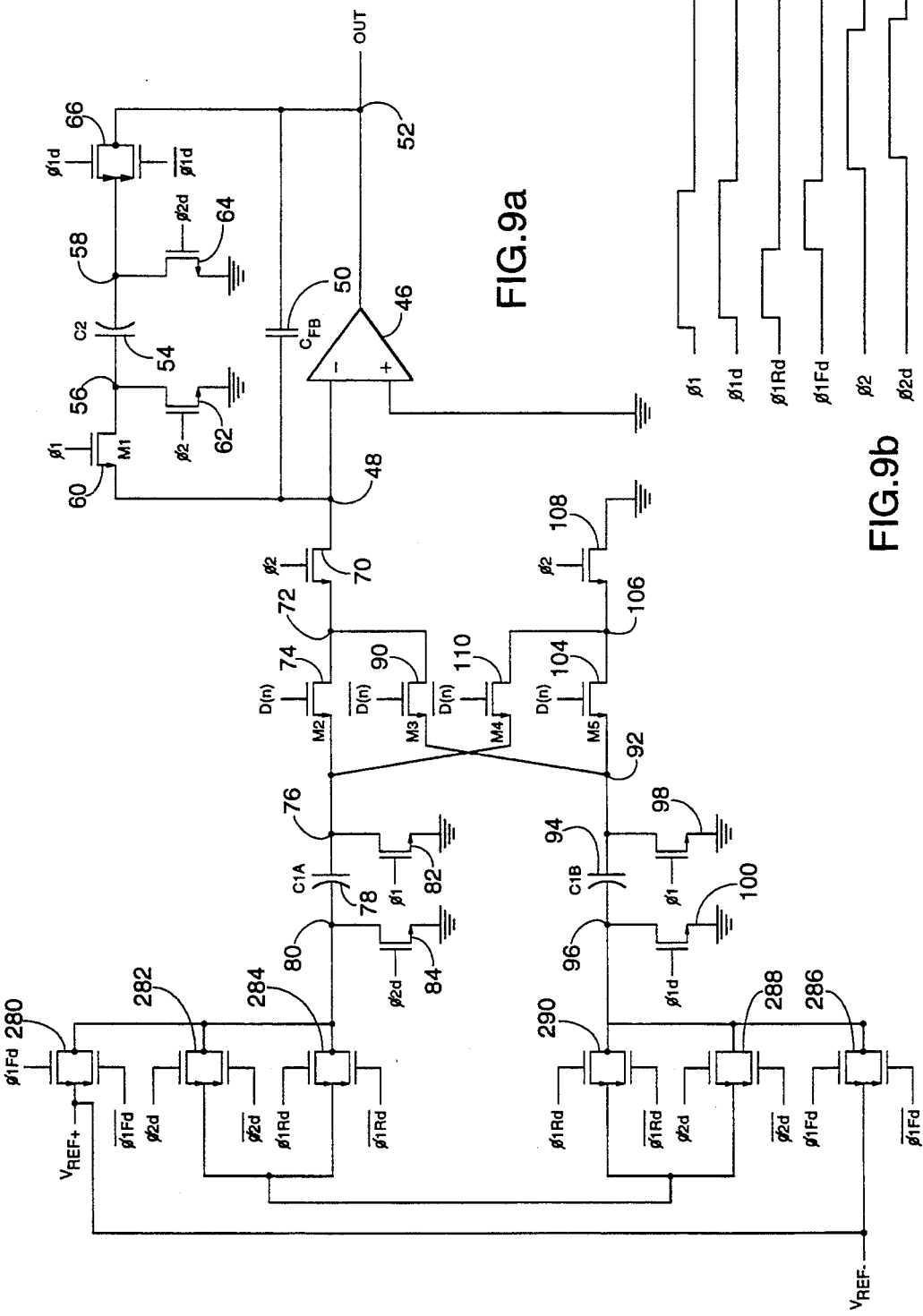

ONE-BIT SWITCHED-CAPACITOR D/A CIRCUIT WITH CONTINUOUS TIME LINEARITY

TECHNICAL FIELD OF THE INVENTION

The present invention pertains in general to digital-to-analog converters, and more particularly, to a one-bit switched-capacitor digital-to-analog converter that converts a digital signal into a continuous time analog signal with high continuous-time linearity.

CROSS REFERENCE TO RELATED APPLICATIONS

This application is related to U.S. Pat. No. 5,245,344, issued Sep. 14, 1993, entitled, "Switched-Capacitor Filter with DAC Input," U.S. Pat. No. 5,239,210, issued Aug. 24, 1993, entitled "Low Distortion Unity Gain Amplifier for DAC" and U.S. Pat. No. 5,198,782, issued Mar. 30, 1992, entitled "Low Distortion Amplifier Output Stage for DAC."

BACKGROUND OF THE INVENTION

In conventional digital-to-analog converters, a first conversion stage is followed by multiple stages of low-pass filtering to filter out unwanted noise. In one type of digital-to-analog converter, a digital delta-sigma modulator is utilized. The delta-sigma modulator receives a digital input and converts it into a one-bit digital output. This output is typically passed through a one-bit DAC and then into an active RC low pass filter. The active RC low pass filter utilizes a series of resistors and various active components to realize the desired filter function. The disadvantage to this type of filter is the sensitivity of the filter to variations in the components. A significant amount of trimming is often required.

A problem exists with conventional digital-to-analog converters utilizing any type of switched capacitor filter is the requirement for conversion from the sampled data domain on the output of the switched capacitor filter to a continuous time domain. In the past, an active filter has been utilized to directly convert between the sampled data output by the switched capacitor and a continuous time output. However, this conversion typically results in a high degree of distortion that is added to the signal. Any distortion is detrimental to the overall performance.

One method proposed to reduce this distortion can be found in related U.S. Pat. No. 5,198,782, entitled, "Switched-Capacitor Filter with DAC Input," U.S. Pat. No. 5,239,210, entitled "Low Distortion Unity Gain Amplifier for DAC" and U.S. Pat. No. 5,198,782, entitled "Low Distortion Amplifier Output Stage for DAC," all of which are incorporated by reference. This method is operable to convert the digital input signal to a sampled analog data signal and then processed it with a sampled data/continuous time buffer of the type illustrated in U.S. Pat. No. 4,698,596, FIG. 8. However, it is not easy to incorporate the D/A architecture into this buffer.

SUMMARY OF THE INVENTION

The present invention disclosed and claimed herein comprises a digital-to-analog converter for receiving a one-bit digital data stream having first and second data states and outputting a continuous time analog signal. The digital-to-analog converter includes an integration stage-having a slew-limited amplifier with a summing input node and an output node with a feedback capacitor disposed between the input and the output nodes. An input charging device is provided for operating in first and second modes. In the first mode, the input charging device is operable to input a finite amount of charge on the summing node. In the second mode, the input charging device is operable to extract a finite amount of charge from the summing node. A modulator is operable to select the first mode for one state of the digital input data and the second mode for the second state of the digital input data. An output switching capacitor device is provided for disposing a predetermined amount of output capacitance across the feedback capacitor to distribute the charge between the feedback capacitor and the predetermined output capacitance. A switching device operates to connect the input charging device to the summing node during a first time period, to selectively add charge thereto or to selectively extract charge therefrom. During a subsequent second time period, the switching device is operable to cause said output switching capacitance device to dispose the associated output capacitance across the feedback capacitor.

In another aspect of the present invention, the input charging device is comprised of first and second switching capacitors, each having first and second plates. The first plate of the first switching capacitor is connected to a positive voltage during the second time period and the second plate thereof connected to ground during the second time period. During the first time period, the first plate of the first switching capacitor is connected to ground and the second plate thereof is connected to the summing node when the modulator selects the first mode. The second switching capacitor, during the second time period, has the first plate thereof and the second plate thereof connected to ground. During the first time period, the second switching capacitor has the first plate thereof connected to the positive reference voltage and the second plate thereof connected to the summing node when the modulator selects the second mode of operation. In one embodiment, the first and second switched capacitors are equal in value.

BRIEF DESCRIPTION OF THE DRAWINGS

For a more complete understanding of the present invention and the advantages thereof, reference is now made to the following description taken in conjunction with the accompanying Drawings in which:

FIGS. 1a and 1b illustrate a switched-capacitor/continuous time buffer circuit in the prior art;

FIG. 2 illustrates a block diagram of the overall system utilizing the modified lossy integrator DAC of the present invention;

FIGS. 9a and 9b illustrate the preferred embodiment of the present invention and the associated timing diagram.

DETAILED DESCRIPTION OF THE INVENTION

Figure 3:
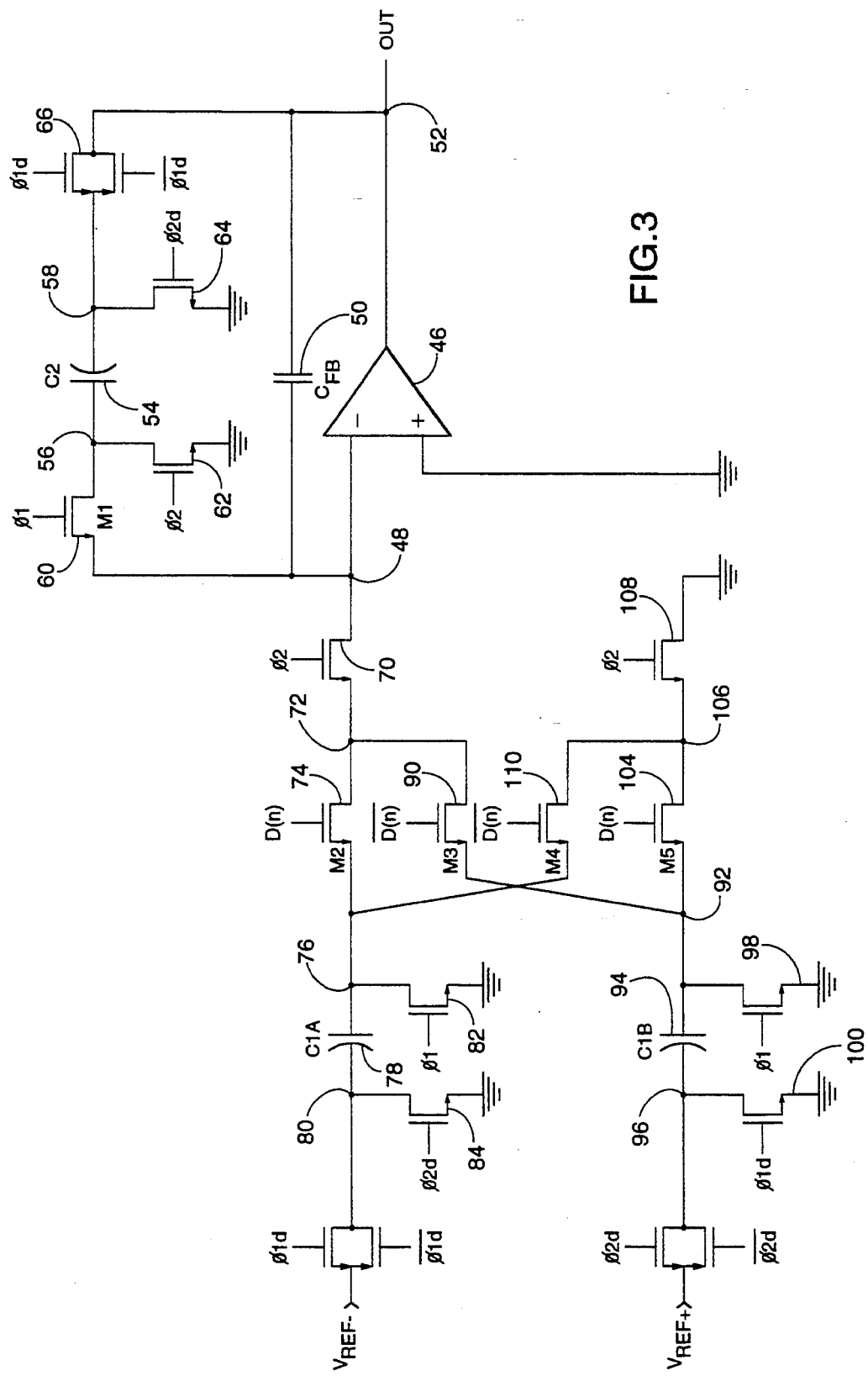
FIG. 3 illustrates a detailed schematic diagram of the modified lossy integrator DAC of the present invention.

Referring now to FIGS. 1a and 1b, there is illustrated a prior art system for converting a digital input value to a continuous time analog output having a high linearity. A one-bit DAC 10 is provided for converting a one-bit digital input stream into an analog output value which is then input to a switched capacitor filter. This is illustrated in FIG. 1a. In FIG. 1b, there is illustrated a detailed schematic of the switched-capacitor buffer 14 of FIG. 1a. An operational amplifier is provided having the positive input thereof connected to ground, the negative input thereof connected to a summing node 20 and the output thereof connected to an output node 21. A feedback capacitor 22, labelled $C_{FB}$, is connected between the summing node and the output node. The summing node 20 is connected through the source/drain path of a transistor 24 to a node 26, the gate thereof connected to a clock signal $\phi 2$. The node 26 is connected through the source/drain path of a transistor 27 to ground, the gate thereof connected to a clock signal $\phi 1$. The node 26 is also connected to one plate of a switched capacitor 28, the other plate thereof connected to a node 30. The node 30 is connected through a gate device to a sampled data analog signal $A_{in}(n)$. The gate device is comprised of an N-channel transistor 32 and a P-channel transistor 34 having the source/drains thereof connected in parallel between the node 30 and the analog input signal $A_{in}(n)$, this analog input signal being in the discrete time processing domain. The gate of transistor 32 is connected to a clock signal $\phi 1$ and the gate of transistor 34 is connected to the inverse of the signal $\phi 1d$. A second gating device comprised of a N-channel transistor 36 and an P-channel transistor 38 is connected between the node 30 and the output of the amplifier 18. The gate of transistor 36 is connected to a clock signal $\phi 2d$ and the other transistor 38 is connected to the inverse of the clock signal $\phi 2d$.

In operation, the buffer of FIG. 1b alleviates the amplifier 18 from charge demand during low-frequency, steady state operation. A single input capacitor, capacitor 28, is switched directly between the input and output, so that when the output voltage is equal to the input voltage and when the input voltage is equal to a relatively low frequency voltage such as DC, there is no net voltage change on any capacitor. Therefore, no charge demand is made on the amplifier output node 21. As such, relatively low distortion results. This is enhanced when it is driving a high impedance load.

Referring now to FIG. 2, there is illustrated a general block diagram of the system of the present invention. The block 42 represents the modified lossy integrator DAC, which is operable to receive a one-bit digital input stream $D_{in}(n)$ and output an analog value in the continuous time domain. This output is then processed through a continuous time filter 44, similar to the continuous time filter 16 of FIG. 1a. This results in the output $A_{out}(t)$ in the analog domain.

Referring now to FIG. 3, there is illustrated a detailed schematic diagram of the modified lossy integrator DAC 42. An operational amplifier 46 is provided having the positive input thereof connected to ground and the negative input thereof connected to a summing node 48. A feedback capacitor 50 is provided having one plate thereof connected to the summing node 48 and the other plate thereof connected to an output node 52, the output node 52 connected to the output of the amplifier 46. A switched-capacitor 54 is provided that has one plate thereof connected to a node 56 and one plate thereof connected to a node 58, capacitor 54 labelled "C2". The node 56 is connected through the source/drain path of a transistor 60 to the summing node 48, the gate of transistor 60 connected to the clock signal $\phi 1$. The node 56 is also connected to ground through the source/drain path of a transistor 62, the gate thereof connected to the clock signal $\phi 2$. The node 58 is connected to ground through the source/drain path of a transistor 64, the gate thereof connected to the clock signal $\phi 2d$. The node 58 is also connected to the source/drain path of a gating device 66 to the output node 52. The gating device 66 comprised of two transistors disposed in parallel, a N-channel transistor and a P-channel transistor, the gate of the N-channel transistor connected to the clock signal $\phi 1$ and the gate of the P-channel transistor connected to the inverse thereof.

The node 48 is connected through the source/drain path of a transistor 70 to a node 72, the gate of transistor 70 connected to the clock signal $\phi 2$. The node 72 is connected through the source/drain path of a transistor 74 to a node 76, the gate of transistor 74 connected to a one-bit data stream D(n). Transistor 74 will conduct whenever the data stream is at a logic "1" state. Node 76 is also connected to one plate of a switching capacitor 78, the other plate thereof connected to a node 80, the capacitor 78 labelled C1A. Node 76 is connected through the source/drain path of a transistor 82 to ground, the gate thereof connected to the clock signal $\phi 1$. Node 80 is connected through the source/drain path of a transistor 84 to ground, the gate thereof connected to the clock signal $\phi 2d$. A gating device 86, comprised of a N-channel transistor having a gate thereof connected to the clock signal $\phi 1$ and a P-channel transistor, having the gate thereof connected to an inverse $\phi 1$ clock signal, connected between the node 80 and a positive reference voltage $V_{ref+}$.

The node 72 is connected through the source/drain path of a transistor 90 to a node 92, the gate of transistor 90 being connected to the inverse of the data signal D(n). The node 92 is connected to one plate of a capacitor 94, the other plate of the capacitor 94 is connected to node 96. The capacitor 94 is labelled "C1B". Node 92 is connected to ground through the source/drain path of a transistor 98, the gate thereof connected to the clock signal $\phi 1$. Node 96 is connected to ground through the source/drain path of a transistor 100, the gate thereof connected to the clock signal $\phi 1d$. Node 96 is also connected through a gating device 102 to the voltage $V_{ref+}$, gating-device 102 being similar to gating device 86, with the N-channel side thereof having the gate thereof connected to the clock signal $\phi 2d$ and the gate of the associated P-channel transistor connected to the $\phi 2d$ inverse clock signal.

The node 92 is connected through the source/drain path of an N-channel transistor 104 to a node 106, the gate of transistor 104 connected to the data stream D(n). Node 106 is connected to ground through the source/drain path of a transistor 108, the gate thereof connected to the $\phi 2$ clock signal. Node 106 is connected through the source/drain path of a transistor 110 to the node 76, the gate of transistor 110 connected to the inverse of the data signal D(n).

The switched-capacitor 78 or switched-capacitor 94, when utilized in conjunction with the integrator comprised of the amplifier 46 and feedback capacitor 50 provides a switched capacitor integrator. The capacitor C2, when switched across the capacitor 50, results in a structure which is similar to what is referred to as a "lossy integrator". As described hereinbelow, the capacitor 54 is phased such that it is isolated from the output whenever charge from the capacitors 78 or 94 are dumped onto the node 48. To realize a digital-to-analog converter topology, the switched-capacitor operation is modulated with the one-bit input data stream D(n). When the data is at a logic "high" state, the node 76 is connected to the node 72 and the node 72 isolated from the node 92. At the same time, node 92 is connected to node 106 such that, when the clock signal $\phi 2$ is high (hereinafter referred to as "during $\phi 2$"), node 106 and node 92 are grounded, thus removing the capacitor 94 from the operation. Conversely, whenever the data is a logic "low", node 92 is connected to node 72 rand node 72 is isolated from node 76, with node 76 connected to node 106 and, subsequently, to ground during $\phi 2$. As will be described hereinbelow, with a one-bit digital data stream, the modified lossy integrator structure allows a continuous time linear analog output to be provided wherein the integrator has a slew limited operation.

Figure 4:
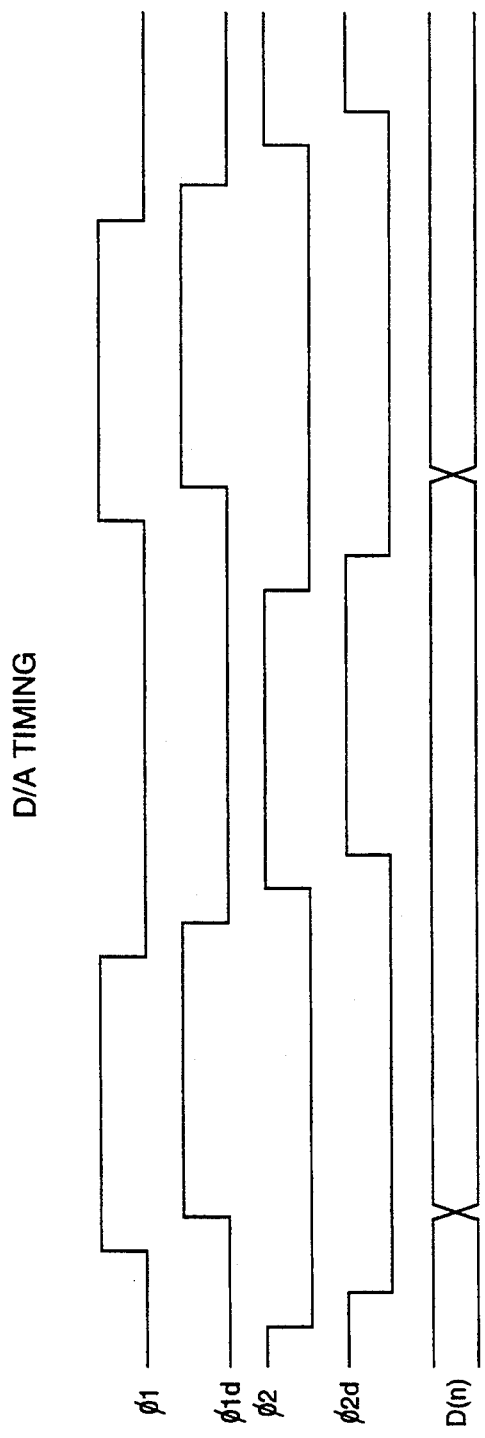
FIG. 4 illustrates timing diagrams for the DAC of FIG. 3.

Referring now to FIG. 4, there are illustrated waveforms depicting the timing of the waveforms for the clock signals $\phi 1$, $\phi 1d$, $\phi 2$, $\phi 2d$ and D(n). Initially, $\phi 1$ and $\overline{\phi 1}$ are low such that capacitor 54 is isolated from the feedback capacitor 50. Nodes 76, 92 and 96 are isolated from ground and node 80 isolated from the reference voltage. Additionally, the clock signals $\phi 2$ and $\phi 2d$ are high, connecting node 72 to the summing node 48, the node 106 to ground, the node 96 to the positive reference voltage and the nodes 56 and 58 to ground. Additionally, node 80 is connected to ground. When the clock signals $\phi 2$ and $\phi 2d$ go low, the capacitor 54 is allowed to float and the node 106 and node 80 are also allowed to float. Additionally, node 72 is now isolated from the summing node 48. When clock signals $\phi 1$ and $\overline{\phi 1}$ go high, the capacitor 54 is connected across the capacitor 50 to allow the charge stored on the capacitor 50 to be redistributed across the capacitor 54. At the same time, the node 80 is connected to the positive reference voltage such that one plate of capacitor 78 is connected to the positive reference voltage and the other plate, via node 76, is connected to ground. This allows capacitor 78 to be charged to a positive voltage. Additionally, both plates of capacitor 94 are grounded with node 96 isolated from the positive reference voltage.

On the next cycle, the clock signals $\phi 1$ and $\overline{\phi 1}$ first go low to again isolate the capacitor 54 from the feedback capacitor 50 and therefore isolate the capacitor 54 from the output. At the same time, both plates of capacitor 94 are removed from ground and node 76 is removed from ground, it being noted that capacitor 78 is now charged to a full $V_{ref}+$ voltage, and the capacitor 94 having no charge stored therein. When $\phi 2$ goes high, the node 72 is connected to the summing node 48. Depending upon the state of the data, either node 76 or node 92 will be connected to the node 72, and subsequently, to the node 48 through the transistor 70. If node 76 is connected to the summing node 48, upon $\phi 2d$ going low, the charge in capacitor 78 will be transferred to the node 48. However, if the node 92 were selected due to the state of the data being a logic "low", the node 96 would be connected to $V_{ref}+$ and charge would be taken away from the node 48. It can be seen that the data determines whether charge is added or removed from the summing node 48 and, since the reference voltage $V_{ref}+$ is constant, an equal amount of charge will be removed or added to the summing node 48, depending upon the state of the data. As will be described hereinbelow, the amplifier 46 is allowed to slew up from one voltage to another by an incremental increase or slew down from one value to another by an incremental decrease in voltage prior to connecting the capacitor 54 across the feedback capacitor 50. This provides a linear operation for a one-bit input data stream.

Figure 5A:
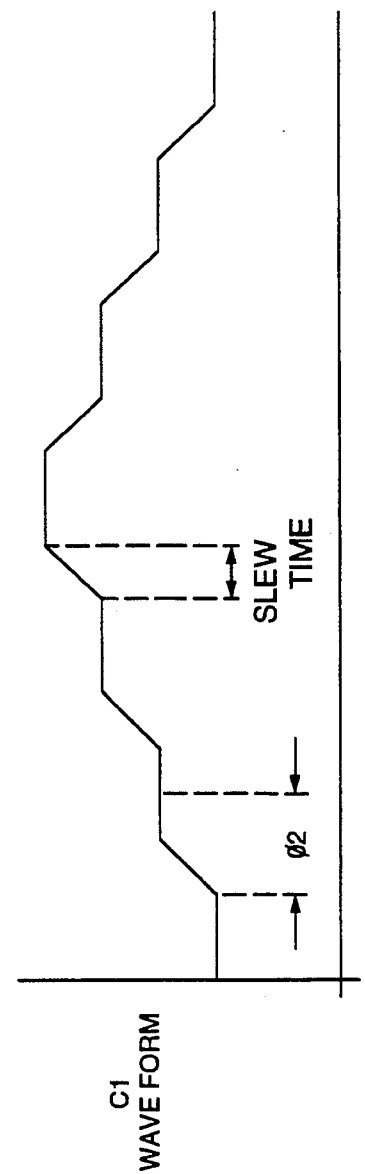
FIGS. 5a–5c illustrate composite output waveforms and the segments of the waveforms that make the composite waveform of the analog output.
Figure 5B:
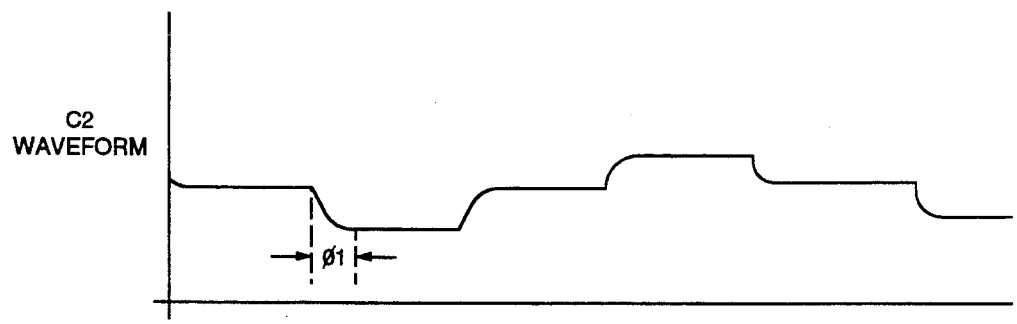
Figure 5C:
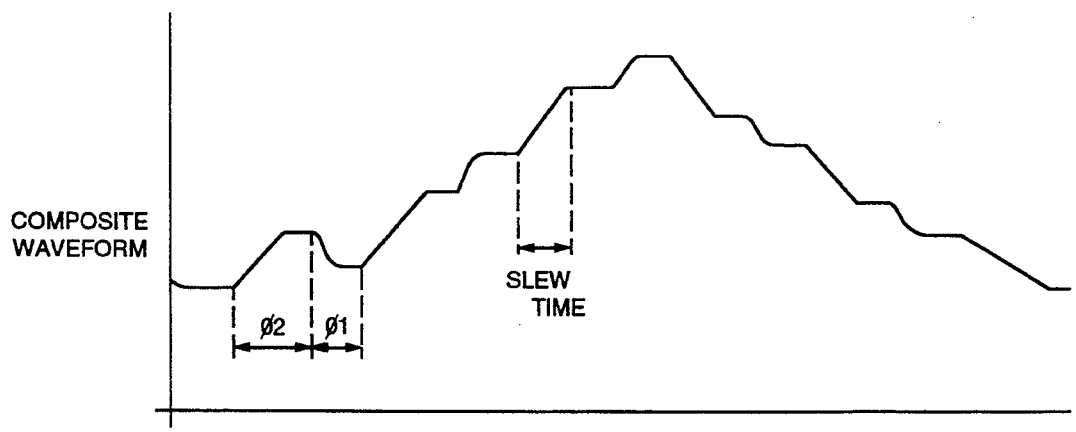

Referring now to FIGS. 5a, 5b and 5c, there are illustrated timing diagrams depicting the composite waveform (FIG. 5c), which is comprised of two separate waveforms, a linear slew waveform (FIG. 5a) and a settling waveform (FIG. 5b). As will be described hereinbelow, the slew-limited operational amplifier 46 operates in a linear mode for a one-bit DAC under the condition that for each sample period, the slew time is equal. The second portion of the composite waveform, the settling time, is attributed to the lossy integrator operation to gain limit the integration operation and allow the output to operate in the continuous time domain. Again, this is a linear operation. In general, a low-pass filter operation is obtained, this being inherent in a lossy integrator.

With specific reference to FIG. 5a, the operation of a switched-capacitor integrator is illustrated, which represents the operation of the operational amplifier 46 and feedback capacitor 50 without the capacitor 54 disposed in parallel therewith. As such, at the beginning of $\phi 2$ going high, the output of the amplifier will slew up or slew down over a defined slew time, this slew time being a constant value and the incremental change in output voltage also being a constant value. For a one-bit DAC, this is an inherent linear operation, assuming that the slew rate of the output waveform is independent of the output. This linearity property is unique only in one-bit inputs. For one-bit inputs, every positive slew-limited step looks identical to every other positive step and every negative step looks identical to every other negative step. Since this output is the addition of these identical steps, the overall waveform is linear, asymmetries between positive and negative slew rates only produce offset and gain errors in the circuit. For multi-bit inputs, the slew time during $\phi 2$ would depend upon the magnitude of the input. Therefore, unlike one-bit inputs, the slew-limited waveforms for multi-bit inputs are highly non-linear.

With specific reference to FIG. 5b, the operation wherein the input capacitors 78 and 94 are disconnected from the summing node 48 and the switched feedback capacitor 54 is connected is illustrated, wherein the capacitor 54 is connected across the feedback capacitor 50 during $\phi 1$ to passively redistribute the charge of feedback capacitor 50. If the switched resistance in transistor 60 is properly scaled, the output will settle in a linear fashion as follows:

$$V_{out}(t, \phi 1) = V_{oi} + (V_{of} - V_{oi}) * (1 - e^{-\frac{t}{\tau c}}) \quad (1)$$

where:

$V_{oi}$=output voltage at the beginning of $\phi 1$ going high;

$V_{of}$=output voltage at the end of $\phi 1$ being high; and

RC=switched resistance of transistor 60 and series value of capacitor 54 and capacitor 50.

The maximum rate of change of this linear response is:

$$\frac{dV}{dt} = \frac{V_{of} - V_{oi}}{rc} \quad (2)$$

One condition for linearity is that this maximum rate-of-change must be less than the amplifier's slew rate. This can be guaranteed by proper scaling of transistor 60 or by adding a linear resistor in series with transistor 60. It can be seen that the decay (or voltage increase) will be initiated at the beginning of $\phi 1$ high at a rate proportional to $e^{-t/rc}$. As will be described hereinbelow, this is a linear operation.

By adding the two waveforms of FIG. 5a and FIG. 5b, the composite waveform of FIG. 5c results. This waveform is comprised of two linear waveforms, and therefore, the overall waveform is linear, as will be described hereinbelow.

Figure 6:
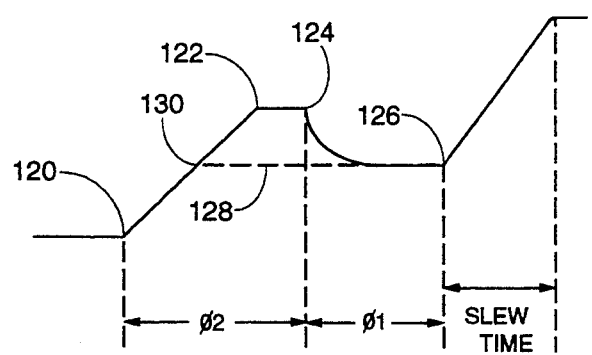
FIG. 6 illustrates a detail of one sample period in the composite waveform of FIG. 5c.

Referring now to FIG. 6, there is illustrated a detail of the composite waveform of FIG. 5c. The charge from the input capacitors is dumped onto the summing node 48 at a point 120 on the waveform and then the output of the amplifier 46 is allowed to slew up to a value at a point 122, this representing the maximum value to which the node 52 will increase during $\phi 2$. Thereafter, the value will remain constant. At the end of $\phi 2$ being high, represented by a point 124, $\phi 1$ is raised to a logic "high" and the value at point 122 is allowed to decay to a value at a point 126 at the end of $\phi 1$ being high. As noted above, the time between point 120 and 122 represents the slew time and this slew operation is completed prior to the initiation of $\phi 1$ at a high logic state. For the case of a conventional lossy integrator wherein the charge across the feedback capacitor 50 were redistributed across capacitor 58 during the time charge was transferred to summing node 48, the waveform would slew in voltage from the point 120 to a voltage level at a point 126. This is represented by a dotted line 128. The dotted line 128 represents the level to which the incremental increase in the output signal from the operational amplifier 18 would have settled with a lossy integrator. It can be seen that this would limit the slew time to a point 130 that is a value less than that of the point 122 such that the slew time is a function of the final settling value and would therefore be different for each sample. If the final settling value varies, the slew time will vary. This results in non-linearity which is inherent in the structure of the lossy integrator. Therefore, it can be seen that the length of time the clock signal $\phi 2$ is at a logic "high" state must be sufficient to insure that the slew time for all input values is equal and the timing of the clock signal $\phi 1$ is raised to a logic "high" such that there is adequate time for the value to decay (or increase) to an appropriate value to allow for the transformation to the continuous time domain.

The waveform of FIG. 6 illustrates that the modified lossy integrator DAC of the present invention provides a continuous-time linear waveform, even though the amplifier slews. This is so because the amplifier is allowed to have only two different slew-time durations, i.e., a-distinct positive slew-time duration and a distinct negative slew-time duration. By utilizing a one-bit DAC on the input to a modified lossy integrator with a reverse phased feedback switched capacitor, this can be achieved with a finite DC gain. This finite DC gain allows the modified lossy integrator to operate under DC input signals.

When one-bit data is processed by slew limited amplifiers, linearity is maintained. This will be shown in the following discussion. The one-bit DAC used in the overall operation of delta-sigma DACs can generally be thought of as a zero-order hold circuit. The input digital data is a stream of impulses:

$$D(t) = \sum_n D(n)\,\delta(t - nT) \quad (3)$$

For an ideal DAC, the optimum analog waveform is therefor:

$$A(t) = h(t) * D(t) \quad (4)$$

where h(t) is the zero-order hold impulse response. In real world DAC circuits, the output waveform is slew-limited. The question is whether this slew-limiting operation distorts the output. As will be show hereinbelow, if the DAC response duration to a $\pm 1$ impulse is less than the sampling period and independent of the output voltage, the one-bit input waveform will not be distorted, illustrated as follows:

$$D(t) = x(t) + y(t) \quad (5)$$

$$X(t) = \frac{1}{2}[D(t) + \Sigma\delta(t - nT)]$$

$$Y(t) = \frac{1}{2}[D(t) - \Sigma\delta(t - nT)]$$

In Equation 5, the value D(t) can only have $+1$ and $-1$ impulse values. D(t) can be separated into an input stream containing only $+1$ impulses plus an input stream containing only $-1$ impulses. The variable x(t) is a data stream that only contains $+1$ impulses, and y(t) is a data stream that only contains $-1$ impulses. Let $h_x(t)$ and $h_y(t)$ be the output responses to a $+1$ and a $-1$ impulse, respectively. Also, $h_x(t)$ and $h_y(t)$ are any function of t.

If the output response settling time of $h_x(t)$ and $h_y(t)$ are less than the sampling period T and independent of the output, then the output waveform is:

$$A(t) = hx(t) * X(t) + hy(t) * Y(t) \quad (6)$$

where "*" is the convolution operator.

Switching to the frequency domain for simplicity purposes, the following relationship will hold:

$$\begin{aligned}A(\omega) &= Hx(\omega)X(\omega) + Hy(\omega)Y(\omega) \quad (7)\\ &= \frac{1}{2}[Hx(\omega) + Hy(\omega)]D(s) + \\ &\quad \frac{1}{2}[Hx(\omega) - Hy(\omega)]\Sigma\delta(\omega - 2\pi f_s)\end{aligned}$$

The second term of this equation has components only at DC, $f_s$, $2f_s$, etc. This term is not considered a distortion of the input (i.e., offset) and it can be dropped from the equation to yield the following:

$$A(\omega) = \frac{1}{2}[Hx(\omega) + Hy(\omega)]D(\omega) \quad (8)$$

From this equation, it can be seen that the output is not distorted, even though the output response $h_x(t)$ and $h_y(t)$ may be slew-limited, non-linear waveforms.

Figure 7A:
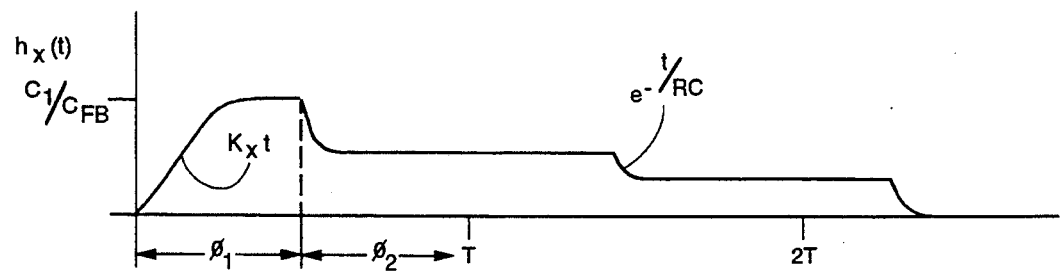
FIGS. 7a–7c illustrate the impulse response of the modified lossy integrator.
Figure 7B:
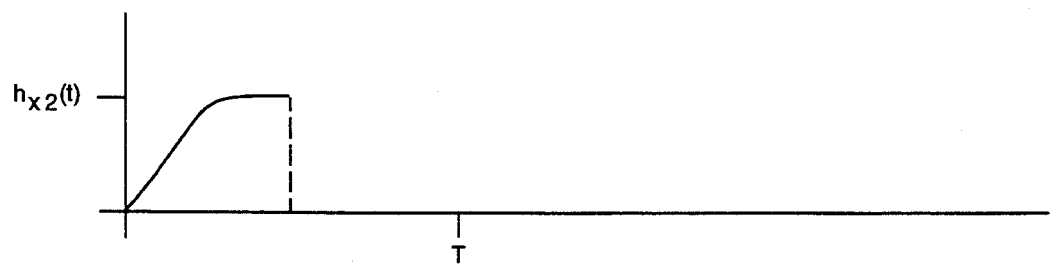
Figure 7C:
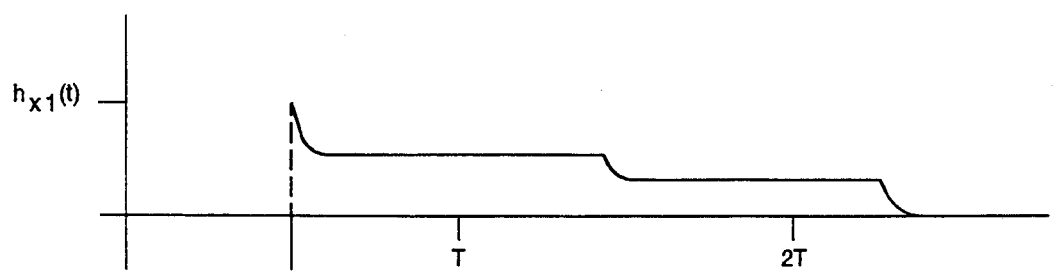

The impulse response of a modified lossy integrator can be illustrated with respect to FIG. 7a, 7b and 7c, which defines the composite response $h_x(t)$ and the two decomposed waveforms $h_{x1}(t)$ and $h_{x2}(t)$. In FIG. 7a, the composite response $h_x(t)$ is illustrated, which is the response of the modified lossy integrator to a positive impulse which results in a slew-limited response $k_xt$ during the switching of the input capacitor during $\phi_2$. At the end of $\phi_2$ and upon the initiation of $\phi_1$, the waveform settles from a value equal to the ratio of the input capacitor $C_1$ and the feedback capacitor $C_{FB}$ at a rate $e^{-t/rc}$ to a lower value. The ratio between the maximum and minimum value for this decay is $(C_{FB}+C_2)/C_{FB}$.

The impulse response of FIG. 7a can be decomposed to the following:

$$h_x(t) = h_{x1}(t) + h_{x2}(t) \quad (9)$$

wherein $h_{x2}(t)$ is the slew-limited response and does meet the conditions for linearity given the non-linear response, described above, this being illustrated in FIG. 7b. The waveform for $h_{x1}(t)$ is illustrated in FIG. 7c and is a linear response associated with the C2 capacitor 54 redistributing charge with $C_{FB}$ capacitor 50, and therefore, the condition that it needs to settle in one sampling period does not need to be met. The analog output waveform will then be defined as follows:

$$A(t) = h_{x2}(t)*X(t) + h_{y2}(t)*Y(t) + h_1(t)*D(t) \quad (10)$$

Where:
$h_{x2}(t)$ = slew-limited response for a $+1$ impulse ($\phi_2$ response);
$h_{y2}(t)$ = slew-limited response for a $-1$ impulse ($\phi_2$ response); and
$h_1(t)$ = linear response during $\phi_1$—note this response must be the same for $+1$ and $-1$ impulses for linearity since it expands many sampling periods.

This will result to the final output waveform in the frequency domain as follows:

$$A(\omega) = \left[\frac{H_{x2}(\omega) + H_{y2}(\omega)}{2} + H_1(\omega)\right]D(\omega) \quad (11)$$

The modified lossy integrator is linear if 1) the slewing portion of the waveform is independent of the output and settles entirely in the $\phi_2$ period, 2) the $\phi_1$ response is completely linear, and 3) the input is a one-bit data stream. It can therefore be seen that with a one-bit data stream, the slew-limited modified lossy integrator response is linear.

Figure 8:
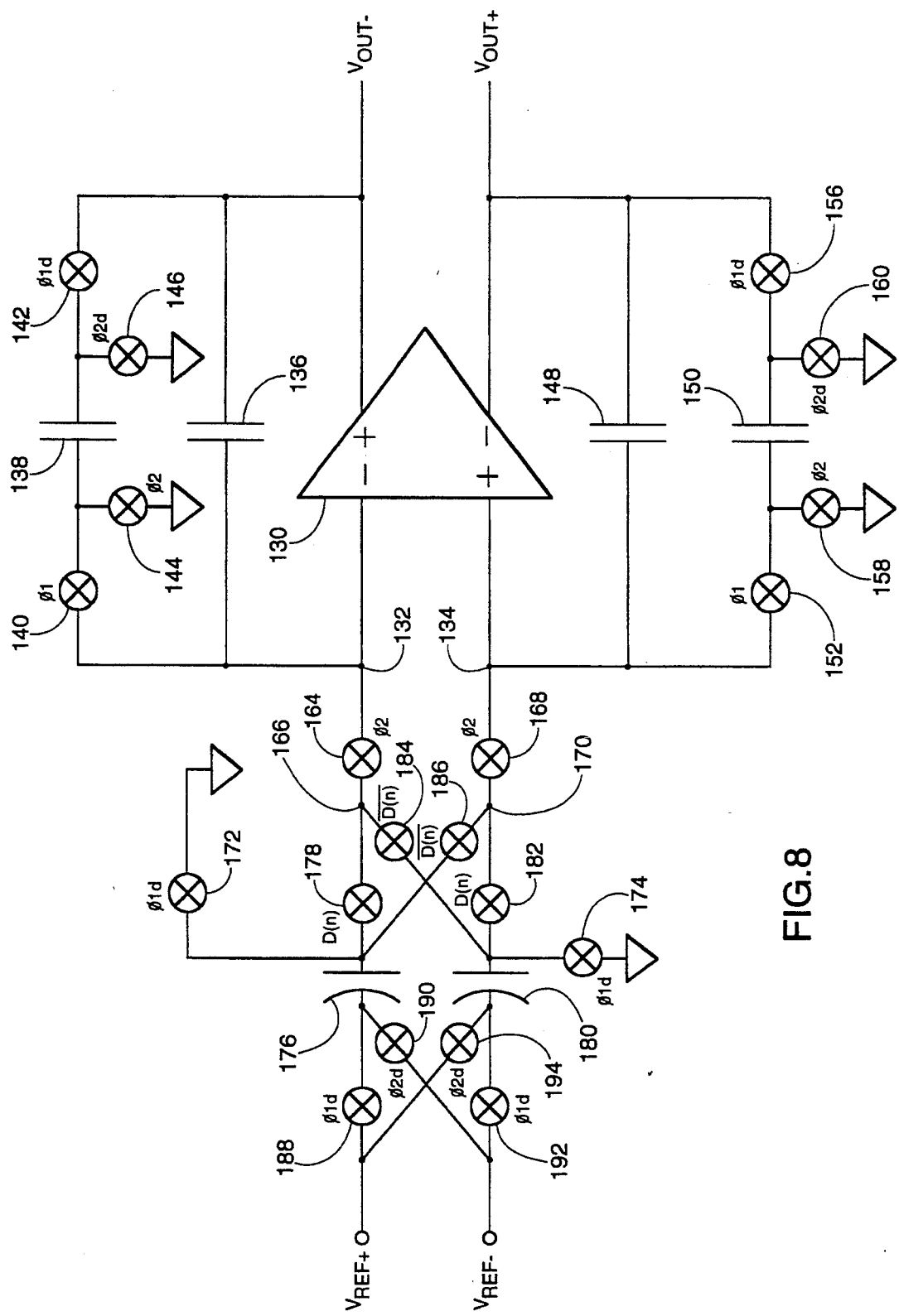
FIG. 8 illustrates an alternate embodiment illustrating a fully differential configuration.

Referring now to FIG. 8, there is illustrated an alternate embodiment utilizing a fully differential configuration. A fully differential operational amplifier 130 is provided having the negative input thereof connected to a positive summing node 132 and the positive input thereof connected to a negative summing node 134. A first feedback capacitor 136 is connected between the summing node 132 and the positive output, with a switched capacitor configuration disposed in parallel therewith. The switched capacitor configuration comprises a switched capacitor 138, a series switch 140 for connecting one plate of capacitor 138 to the node 132 and a series switch 142 for connecting the other plate of the capacitor 138 to the positive output. Two switches 144 and 146 are provided on respective plates of the capacitor 138 to connect the respective plates to ground. The switched capacitor configuration operates to ground both plates of the capacitor 138 during transfer of input charge to the summing node 132, and, after the charge has been transferred, to dispose the capacitor 138 across the capacitor 136 to redistribute the charge on capacitor 136, as described above. A similar feedback capacitor 148 is disposed between the summing node 134 and a negative output. A switching capacitor structure is also disposed across the capacitor 148, with a switching capacitor 150 disposed with one of the plates thereof connected in series through a switch 152 to the summing node 134 and the other plate thereof connected through a series switch 156 to the negative output node. Two switches 158 and 160 are connected between respective plates of the capacitor 150 and ground. The capacitor 150 has both plates thereof connected to ground during the time that input charge is transferred to node 134, and is disposed across the capacitor 148 in the next cycle to redistribute the charge across capacitor 148.

The node 132 is connected through a series switch 164 to an intermediate node 166. Similarly, node 134 is connected through a series switch 168 to an intermediate node 170. The node 166 is connected to one plate of a first switching capacitor 176 through a switch 178, and intermediate node 170 is connected to one plate of a second switching capacitor 180 through a switch 182. Alternately, node 166 can be connected to the one plate of the capacitor 180 through a switch 184 and node 170 can be connected to one plate of the capacitor 176 through a switch 186. The one plate of capacitor 176 is connected to ground through a switch 172 and the one plate of the capacitor 180 is connected to ground through a switch 174.

The other plate of capacitor 176 is connected through a switch 188 to a positive reference voltage $V_{REF+}$ or through a switch 190 to a negative reference voltage $V_{REF-}$. The other plate of the capacitor 180 is also connectable through a switch 192 to the negative reference voltage $V_{REF-}$ or through a switch 194 to the positive reference voltage $V_{REF+}$.

In operation, the switches 184, 186, 178 and 182 are modulated by the data input, similar to that described above with respect to transistors 90, 110, 74 and 104. During $\phi_1$ for D(n)=logic "high", switch 164 is open and switch 172 is closed in order to dispose the one plate of capacitor 176 connected to switch 178 at ground potential, with the other plate of capacitor 176 connected through switch 188 to the $V_{REF+}$ voltage. During $\phi_2$, when $\phi_1$ is at a logic "low", the switch 188 is opened and switch 190 is closed to connect the other plate of capacitor 176 to the $V_{REF-}$ voltage, with the one plate of capacitor 176 connected to switch 178 disconnected from ground potential by opening switch 172. Switch 164 will then close to transfer charge from the capacitor 176 to the node 132 through switches 178 and 164. Similarly, for D(n)=logic "high", a negative charge will be added to the summing node 134. During $\phi_1$, the one plate of capacitor node 180 is connected to ground through switch 174 and the other plate of capacitor 180 is connected to the $V_{REF-}$ input voltage.

During $\phi2$, when $\phi1$ is at a logic "low", the one plate of capacitor 180 connected to switch 182 is connected through the switches 182 and 168 to node 134, and the other plate of capacitor 180 is connected through switch 194 to the positive reference voltage $V_{REF+}$.

On the other state of the data, D(n)=logic "low", the operation is changed such that during $\phi1$, the capacitors 176 and 180 are charged and, during $\phi2$, the one plate of capacitor 176 on the switch 178 side is connected to node 170 through the switch 186 with switch 178 open, and the one plate of capacitor 180 on the switch 182 side is connected through the switch 184 to the node 166, switch 182 open.

The switched capacitors 138 and 150 operate similar to that described above with respect to switched capacitor 54. During $\phi2$, both plates of capacitors 138 and 150 are connected to ground and, during $\phi1$, the capacitors 138 and 150 are connected across the respective feedback capacitors 136 and 148.

Referring now to FIG. 9a, there is illustrated the preferred embodiment of the present invention which is substantially similar to the embodiment of FIG. 3 with the addition of an alternate input configuration. Node 80 is connected through a gate 280 to a positive reference voltage $V_{REF+}$, the gate 280 being a transmission gate with a P-channel and N-channel transistor having the sources and drains thereof connected together, with the gate of the N-channel transistor therein connected to the signal $\phi1Fd$ and the gate of the P-channel transistor connected to the inverted signal thereof $\phi1Fd$-Bar. The node 80 is also connected through a gate 282 to a negative reference voltage $V_{REF-}$, the gate 282 controlled by the signals $\phi2d$ and $\phi2d$-Bar. The node 80 is also connected through a gate 284 to the negative reference voltage, with the gate 284 controlled by the signals $\phi1R$ and the inverse thereof. Node 96 is connected through a gate 286 to the negative reference voltage $V_{REF-}$, the gate 286 controlled by the signals $\phi1Fd$ and the inverse thereof. Node 96 is connected through a gate 288 to the positive reference voltage $V_{REF+}$, the gate 288 controlled by the signal $\phi2d$ and the inverse thereof. Node 96 is also connected to the positive reference voltage $V_{REF+}$ through a gate 290, gate 290 controlled by the signal $\phi1Rd$ and the inverse thereof.

The signals $\phi1Fd$ and $\phi1Rd$ are referred to as the fine and rough clock signals. These signals are utilized to improve the linearity of sampling networks in order to provide analog-to-digital converters having signal-to-distortion ratios of greater than 110 dB. The timing diagrams for these are illustrated in FIG. 9b. In general, the rough and fine clock signals, in accordance with the embodiment illustrated in FIG. 9, will reduce the effects of charge injection. This is described in detail in U.S. patent application Ser. No. 08/036,471, filed Mar. 24, 1993, entitled "Sampling Circuit Charge Management".

In summary, there has been provided a modified lossy integrator DAC for use with a one-bit digital data stream. The modified lossy integrator includes an operational amplifier having a feedback capacitor disposed between the input summing node and the output, and having a switching input capacitor disposed on the summing node and a switching capacitor disposed across the feedback capacitor. The input capacitor is switched between ground and the positive reference voltage, and modulated with a one-bit data stream, there being two such input switched-capacitors of equal value. During one phase of a clock cycle, the switched-capacitor has a charge thereon dumped onto an input summing node such that the output of the amplifier will increase or decrease in value at a predefined slew rate, which is a function of the amplifier. Once the charge is dumped onto the summing node, the switched-capacitor on the input is then disconnected and the switched capacitor in parallel with the feedback capacitor is disposed across the feedback capacitor to passively distribute the charge thereon. This will effectively limit the gain of the integrator. By allowing this operation to receive the full charge of the input switched capacitor before applying the output switched capacitor across the feedback capacitor, the slew-limited operation is maintained in a linear range. Thereafter, the passive redistribution of the charge, which is a linear operation, will achieve the effect of the output operation that provides a substantially linear conversion from a digital input value to a continuous time output.

Although the preferred embodiment has been described in detail, it should be understood that various changes, substitutions and alterations, such as fully differential topologies, can be made therein without departing from the spirit and scope of the invention as defined by the appended claims.

What is claimed is:

1. A data conversion system including digital-to-analog converter having a digital input and an analog output, the digital input for receiving a digital signal and having at least a first logic state and a second logic state, and outputting a continuous time analog output signal on the analog output, the digital-to-analog converter comprising:

a first circuit responsive to the presence of the first logic state on the digital input for causing the analog output to change in value independent of the output in accordance with a predetermined transfer function, said change in value being substantially the same each time the first logic state is present on the digital input a second circuit responsive to the presence of the second logic state on the digital input for causing the analog output to change in value independent of the output in accordance with said predetermined transfer function, said change in value caused by said second circuit being substantially the same each time the second logic state is present, the analog output signal on the analog output having a substantially linear response in the continuous time domain due to said first and second circuits, and a redistribution circuit operable to limit the DC gain of said predetermined transfer function to a known and fixed quantity.

2. The data conversion system of claim 1, wherein the digital signal is a one-bit digital input signal comprising a one-bit digital input data stream.

3. The data conversion system of claim 1, wherein the change in value of the analog output signal due to said first circuit is substantially equal and opposite to the change in value of the analog output signal due to said second circuit.

4. A data conversion system having a digital-to-analog converter for receiving a one-bit digital input data stream having first and second states and outputting a continuous time analog signal, the digital-to-analog converter comprising:

an integration stage having an amplifier with a summing input node and an output node, and a feedback capacitor disposed between said summing input node and said output node;

an input charging device operating in first and second modes, said input charging device in said first mode operable to input a finite amount of charge to said summing node and, in a said second mode, operable to extract a finite amount of charge from said summing node;

an output capacitance device for selectively disposing an output capacitance across said feedback capacitor to distribute the charge on said feedback capacitor between said feedback capacitor and said output capacitance; and a switching device for controlling said input charging device to connect said input charging device to said summing node during a first time period to selectively add charge thereto or selectively extract charge therefrom, said switching device operable to select said first mode in said input charging device for the first state of the input digital data stream and to select said second mode in said input charging device for the second state of the digital input data stream, said switching device also operable to control said output capacitance device to connect said output capacitance across said feedback capacitor during a second and subsequent time period.

5. The data conversion system of claim 4, wherein said finite amount of charge input to said summing input node and said finite amount of charge extracted from said summing input node have substantially the same magnitude.

6. The data conversion system of claim 4, wherein said input charging device comprises:

a first switched-capacitor having first and second plates;

a first switching circuit operable during said second time period to switch said first plate to a positive reference voltage and said second plate to a negative reference voltage lower than said positive reference voltage and, during said first time period, switching said first plate to said negative reference voltage and said second plate to a first switching node;

a second switched capacitor having first and second plates;

a second switching circuit for controlling said second switching capacitor, and operable during said second time period to switch said first and second plates to said negative reference voltage and, during said first time period, switching said first plate to said positive reference voltage and said second plate to a second switching node; and said switching device operable to select which of said first and second switching nodes are connected to said summing node in accordance with the state of the digital input data stream.

7. The data conversion system of claim 6, wherein said first and second switched capacitors are of substantially the same value.

8. The data conversion system of claim 6, wherein said negative reference voltage comprises ground.

9. The data conversion system of claim 6, wherein said output capacitance device comprises an output capacitor having associated therewith first and second plates, with first and second switching devices associated with said first and second plates, respectively, said first and second switching devices operable during said first time period to connect said associated first and second plates to said negative reference voltage and, during said second time period, to connect said respective first and second plates to said summing node and said output node, respectively.

10. A method for converting a one-bit digital input data stream having first and second logic states to a continuous time analog output signal, comprising the steps of:

providing a summing node and an output node;

disposing an integration stage between the summing node and the output node, the integration stage operable to integrate charge supplied to the summing node across a feedback capacitor disposed between the summing and output nodes to provide an integrated output signal on the output node;

adding a first predetermined amount of charge to the summing node during a first time period in the presence of the first logic state of the digital input data stream;

extracting a predetermined amount of charge from the summing node during the first time period and in the presence of a second logic state of the digital input signal; and disposing an output capacitor across the feedback capacitor during a second time period subsequent to the first time period to distribute the charge in the feedback capacitor across the output capacitor and the feedback capacitor.

11. The method of claim 10, wherein the first and second predetermined amount of charges are substantially equal.

12. The method of claim 10, wherein the step of adding the first predetermined amount of charge comprises:

charging a first switching capacitor having first and second plates to a first voltage across the first and second plates with the first plate disposed at the higher voltage during the second time period; and connecting the first plate of the first switched capacitor to a negative reference voltage and the second plate of the first switched capacitor to the summing node during the first time period and during the presence of the first logic state of the digital input data stream.

13. The method of claim 12, wherein the step of extracting the second predetermined amount of charge from the summing node during the first time period comprises:

providing a second switching capacitor having first and second plates;

during the second time period, connecting the first and second plates of the second switching capacitor to the negative reference voltage; and during the first time period, connecting the first plate of the capacitor to the positive reference voltage and the second plate of the capacitor to the summing node during the presence of the second logic state of the digital input data stream.

14. A digital-to-analog converter for receiving a one-bit digital input data stream having first and second states and outputting a continuous time differential analog signal, comprising:

an integration stage having a differential amplifier with a positive summing input node, a positive output node, a negative summing input node, and a negative output node, and first and second feedback capacitors disposed between said positive and negative summing input nodes and said positive and negative output nodes;

positive and negative input charging devices, each of said positive and negative input charging devices operating in first and second modes, in said first mode said input charging devices operable to input a finite amount of charge to said positive and negative summing nodes and, in said second mode, operable to extract a finite amount of charge from said positive and negative summing nodes;

first and second output capacitance devices associated with said first and second feedback capacitors, respectively, for disposing respective first and second output capacitances across said first and second feedback capacitors to distribute the charge on said first and second feedback capacitors between said respective first and second feedback capacitors and said respective output capacitances; and a switching device for controlling said positive and negative input charging devices to operate in said first mode for the first state of the input digital data stream and to operate in said second mode for the second state of the digital input data stream, said switching device operable to connect said positive and negative input charging devices to said positive and negative summing input nodes during a first time period to selectively add charge thereto or selectively subtract charge therefrom and connecting said first and second output capacitances across said respective first and second feedback capacitors during a second and subsequent time period.

* * * * *